(12) United States Patent
Yasunami et al.

(10) Patent No.: US 6,777,161 B2
(45) Date of Patent: Aug. 17, 2004

(54) LOWER LAYER RESIST COMPOSITION FOR SILICON-CONTAINING TWO-LAYER RESIST

(75) Inventors: Shoichiro Yasunami, Shizuoka (JP); Kazuyoshi Mizutani, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 304 days.

(21) Appl. No.: 10/118,896

(22) Filed: Apr. 10, 2002

(65) Prior Publication Data

US 2003/0059552 A1 Mar. 27, 2003

(30) Foreign Application Priority Data

Apr. 13, 2001 (JP) .................................. P. 2001-115597

(51) Int. Cl.$^7$ ............................ G03C 1/74; G03C 1/73; G03C 1/825; G03F 7/038; G03F 7/30; G03F 7/36
(52) U.S. Cl. .................... 430/270.1; 430/905; 430/914; 430/921; 430/925; 430/927; 430/909; 430/325; 430/326; 430/313
(58) Field of Search .......................... 430/270.1, 905, 430/914, 921, 925, 927, 909, 325, 326, 313

(56) References Cited

U.S. PATENT DOCUMENTS 6,503,692 B2 * 1/2003 Angelopoulos et al. ..... 430/310
6,514,663 B1 * 2/2003 Hien et al. ............... 430/270.1

FOREIGN PATENT DOCUMENTS

| EP | 1 048 980 A1 | 11/2000 |
| JP | 2000-321776 A | 11/2000 |
| WO | WO 00/53645 A1 | 9/2000 |
| WO | WO 00/54105 A1 | 9/2000 |

* cited by examiner

*Primary Examiner*—Rosemary Ashton
*Assistant Examiner*—Sin J. Lee
(74) *Attorney, Agent, or Firm*—Sughrue Mion, PLLC

(57) ABSTRACT

To provide a lower layer resist composition for a silicon-containing two-layer resist, which is excellent in the dry etching resistance and film thickness uniformity.

A lower layer resist composition for a silicon-containing two-layer resist, comprising (a) a phenol-based polymer, (b) a compound capable of generating a sulfonic acid at a temperature of 100° C. or more, (c) a phenol-based acid crosslinking agent having two or more benzene rings and capable of crosslinking with the polymer under the action of an acid, and (d) a solvent.

14 Claims, No Drawings

US 6,777,161 B2

LOWER LAYER RESIST COMPOSITION FOR SILICON-CONTAINING TWO-LAYER RESIST

FIELD OF THE INVENTION

The present invention relates to a lower layer resist for a silicon-containing two-layer resist which is used for exposure by an energy ray such as ultraviolet ray, far ultraviolet ray, X ray, electron beam, molecular ray and γ ray, more specifically, the present invention relates to a lower layer resist for a silicon-containing two-layer resist for fine working which is used in the production process of a semiconductor such as IC, for example, at the production of a circuit board or the like.

BACKGROUND OF THE INVENTION

Accompanying higher integration of LSI, the resolution attainable by a conventional single layer resist is limited and there has been proposed a method of forming a fine pattern having a large film thickness and a high form ratio by constructing a resist not in a single layer structure but in a multilayer structure. More specifically, an organic polymer thick film is formed as the first layer and a thin film resist material layer is formed as the second layer thereon. A high energy ray is irradiated on the resist material of the second layer and using the pattern obtained after the development as a mask, the organic polymer of the first layer is anisotropically etched by oxygen plasma etching (O2-RIE) to obtain a pattern having a high rectangular shape property (see, Lin, *Solid State Technology*, Vol. 24, page 73 (1981)). This method is generally called a two-layer resist process and since the second resist layer is a thin film, the obtained lithography performance is expected to surpass that by an ordinary single layer resist.

In this case, since the second resist layer (hereinafter simply referred to as an "upper layer") must have high resistance against O2-RIE, a silicon-containing polymer is usually used therefor. Many silicon-containing photosensitive compositions using such a polymer have been proposed.

As for the first resist layer (hereinafter simply referred to as a "lower layer"), a method of processing a novolak resin or the like at a high temperature and then curing it is widely employed so as to attain good adhesion to the substrate, good film forming property, high resistance against dry etching, incompatibility with and good adhesion to the upper layer, high light absorption property for the exposure wavelength, and the like. However, since a reaction at a high temperature for a long period of time is necessary, not only the throughput is extremely reduced but also a decomposed material is produced by the high-temperature long-term processing to cause contamination of the apparatus. In order to solve these problems, a method of using the polymer in combination with a thermal acid generator and a crosslinking agent in the lower layer has been proposed. WO00/53645 discloses a combination of a sulfonic acid ester-type thermal acid generator and a crosslinking agent having an epoxy structure and WO00/54105 discloses a combination of a sulfonic acid ester-type thermal acid generator and a crosslinking agent having a melamine skeleton structure. These can be cured within a relatively short time but are disadvantageously poor in the dry etching resistance.

Also, JP-A-2000-321776 (the term "JP-A" as used herein means an "unexamined published Japanese patent application") discloses a combination of a thermal acid generator having a sulfonic acid ester or onium salt structure and a crosslinking agent having a cresol skeleton, however, this composition has a problem in that the film after heat curing is non-uniform in the density and poor in the film thickness uniformity. Thus, improvement is strongly demanded.

SUMMARY OF THE INVENTION

An object of the present invention is to provide a lower layer resist for a silicon-containing two-layer resist used for exposure by an energy ray such as ultraviolet ray, far ultraviolet ray, X ray, electron beam, molecular ray and γ ray, particularly, a lower layer resist for a silicon-containing two-layer resist, which can cope with exposure in the far ultraviolet region at the production of a semiconductor device.

Another object of the present invention is to provide a lower layer resist for a silicon-containing two-layer resist, having excellent dry etching resistance.

Still another object of the present invention is to provide a lower layer resist for a silicon-containing two-layer resist, having excellent film thickness uniformity.

As a result of extensive investigations by taking notice of the above-described various properties, the present inventors have accomplished the present invention. More specifically, the objects of the present invention can be attained by the following constructions:

(1) a lower layer resist composition for a silicon-containing two-layer resist, comprising (a) a phenol-based polymer, (b) a compound capable of generating a sulfonic acid at a temperature of 100° C. or more, (c) a phenol-based acid crosslinking agent having two or more benzene rings and capable of crosslinking with the polymer under the action of an acid, and (d) a solvent;

(2) the lower layer resist composition for a silicon-containing two-layer resist as described in (1), wherein the phenol-based polymer is at least one member selected from a novolak resin and a homopolymer or copolymer having a polyvinyl phenol site;

(3) the lower layer resist composition for a silicon-containing two-layer resist as described in (1) or (2), wherein the phenol-based polymer is a copolymer having a polyvinyl phenol site and at a side chain at least one group selected from the group consisting of a chain hydrocarbon group, an alicyclic hydrocarbon group and a bridged alicyclic hydrocarbon group;

(4) the lower layer resist composition for a silicon-containing two-layer resist as described in any one of (1) to (3), wherein the phenol-based acid crosslinked agent has from 3 to 5 benzene rings;

(5) the lower layer resist composition for a silicon-containing two-layer resist as described in any one of (1) to (4), wherein the compound capable of generating a sulfonic acid is at least one member selected from a secondary or tertiary alcohol ester of sulfonic acid and an iodonium salt of sulfonic acid;

(6) the lower layer resist composition for a silicon-containing two-layer resist as described in any one of (1) to (5), which further contains a nitrogen-containing compound;

(7) the lower layer resist composition for a silicon-containing two-layer resist as described in any one of (1) to (6), which further contains a surfactant;

(8) A pattern-forming method which comprises steps: coating on a substrate a lower layer resist composition for a silicon-containing two-layer resist, comprising (a) a phenol-based polymer, (b) a compound capable of generating a sulfonic acid at a temperature of 100° C. or more, (c) a phenol-based acid crosslinking agent having two or more benzene rings and capable of crosslinking with the polymer under the action of an acid, and (d) a solvent to form a lower (layer) resist layer;

forming on the lower (layer) resist layer an upper layer resist composition to from an upper layer resist layer; and irradiating a high energy ray to form a pattern;

(9) the pattern-forming method as described in (8), wherein the phenol-based polymer is at least one member selected from a novolak resin and a homopolymer or copolymer having a polyvinyl phenol site;

(10) the pattern-forming method as described in (8) or (9), wherein the phenol-based polymer is a copolymer having a polyvinyl phenol site and at a side chain at least one group selected from the group consisting of a chain hydrocarbon group, an alicyclic hydrocarbon group and a bridged alicyclic hydrocarbon group;

(11) the pattern-forming method as described in any one of (8) to (10), wherein the phenol-based acid crosslinked agent has from 3 to 5 benzene rings;

(12) the pattern-forming method as described in any one of (8) to (11), wherein the compound capable of generating a sulfonic acid is at least one member selected from a secondary or tertiary alcohol ester of sulfonic acid and an iodonium salt of sulfonic acid;

(13) the pattern-forming method as described in any one of (8) to (12), wherein the lower layer resist composition further contains a nitrogen-containing compound; and

(14) the pattern-forming method as described in any one of (8) to (13), wherein the lower layer resist composition further contains a surfactant.

DETAILED DESCRIPTION OF THE INVENTION

The practical embodiment of the present invention is described below, however, the present invention is not limited thereto.

(a) Phenol-based Polymer

In the present invention, various phenol-based polymers having a phenol structure moiety may be used. Preferred examples thereof include a novolak resin, a p-hydroxystyrene homopolymer, an m-hydroxystyrene homopolymer, a copolymer having a p-hydroxystyrene structure and a copolymer having an m-hydroxystyrene structure. In these copolymers, the copolymerization moiety preferably has a repeating unit represented by the following formula (1):

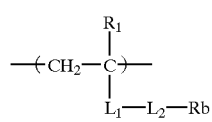

(1)

wherein $R_1$ represents a hydrogen atom, an alkyl group having from 1 to 3 carbon atoms, a cyano group or a halogen atom, preferably a hydrogen atom or a methyl group, $L_1$ represents a single bond, —COO—, —CON($R_3$)— or an arylene group, preferably a single bond, —COO— or a phenylene group, $R_3$ represents a hydrogen atom or an alkyl group having from 1 to 3 carbon atoms, $L_2$ represents a single bond, an alkylene group having from 1 to 10 carbon atoms, an arylene group having from 6 to 18 carbon atoms, —COO— or —O—, preferably a single bond, an alkylene group having from 1 to 4 carbon atoms or a phenylene group, and Rb represents an alkyl group having from 1 to 10 carbon atoms, a cycloalkyl group having from 4 to 30 carbon atoms, a bridged alicyclic hydrocarbon group having from 5 to 25 carbon atoms or an aryl group having from 6 to 18 carbon atoms, preferably an alkyl group having from 1 to 8 carbon atoms (e.g., methyl, ethyl, butyl, tert-butyl), a cycloalkyl group having from 5 to 8 carbon atoms (e.g., cyclohexyl, cyclooctyl), a bridged alicyclic hydrocarbon group having from 5 to 20 carbon atoms, or an aryl group having from 6 to 12 carbon atoms (e.g., phenyl, naphthyl). These groups each may have a substituent and examples of the substituent include a halogen atom (e.g., Cl, Br), a cyano group, an alkyl group having from 1 to 4 carbon atoms, a hydroxy group, an alkoxy group having from 1 to 4 carbon atoms, an acyl group having from 1 to 4 carbon atoms and an aryl group having from 6 to 12 carbon atoms. Preferred skeletons of the bridged alicyclic hydrocarbon group having from 5 to 20 carbon atoms are set forth below.

(1)

(2)

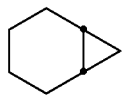

(3)

(4)

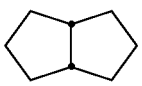

(5)

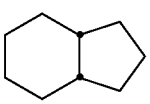

(6)

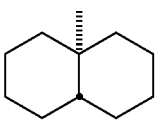

(7)

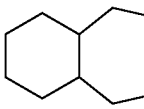

(8)

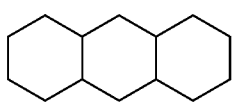

(9)

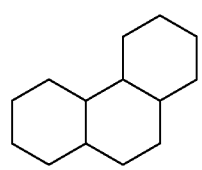

(10)

(11) 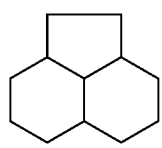
(12) 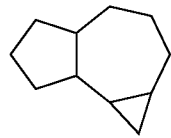
(13) 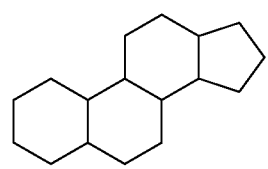
(14) 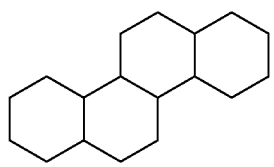
(15) 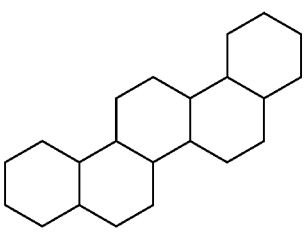
(16) 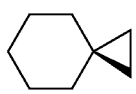
(17) 
(18) 
(19) 
(20) 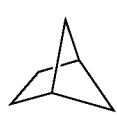
(21) 
(22) 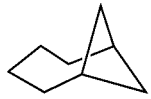
(23) 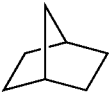
(24) 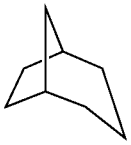
(25) 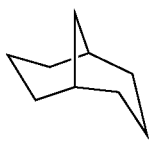
(26) 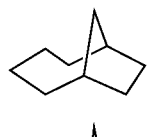
(27) 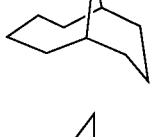
(28) 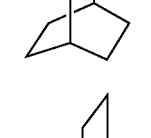
(29) 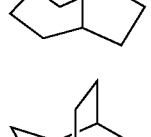
(30) 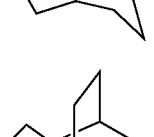
(31) 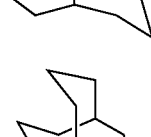
(32) 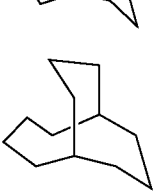

(34) 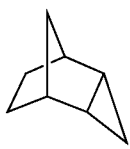

(35) 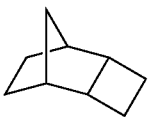

(36) 

(37) 

(38) 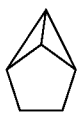

(39) 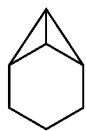

(40) 

(41) 

(42) 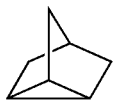

(43) 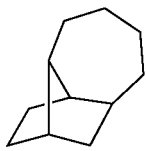

(44) 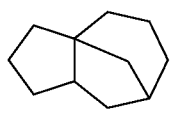

(45) 

(46) 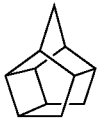

(47) 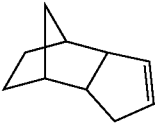

Among these, preferred are (5), (6), (7), (8), (9), (10), (13), (14), (15), (23), (28), (36), (37), (40), (42) and (47).

In the case where the polymer for use in the present invention is the above-described copolymer, the content of the repeating unit represented by formula (1) is preferably from 0 to 80%, more preferably from 0 to 60%. In addition to this repeating unit, the copolymer may have another repeating unit for the purpose of improving film-forming property, adhesion, developability and the like.

The phenol-based polymer (a) for use in the present invention may be a copolymer having, in addition to the repeating unit represented by formula (1), another repeating unit for the purpose of improving the film-forming property, adhesion, developability and the like.

Examples of the monomer corresponding to the another repeating unit include compounds having one addition polymerizable unsaturated bond, selected from acrylic acid esters, methacrylic acid esters, acrylamides, methacrylamides, allyl compounds, vinyl ethers and vinyl esters.

Specific examples thereof include acrylic acid esters such as alkyl (the alkyl group preferably has from 1 to 10 carbon atoms) acrylate (e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, trimethylolpropane monoacrylate, pentaerythritol monoacrylate, benzyl acrylate, methoxybenzyl acrylate, furfuryl acrylate, tetrahydrofurfuryl acrylate);

methacrylic acid esters such as alkyl (the alkyl group preferably has from 1 to 10 carbon atoms) methacrylate (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, trimethylolpropane monomethacrylate, pentaerythritol monomethacrylate, furfuryl methacrylate, tetrahydrofurfuryl methacrylate);

acrylamides such as acrylamide, N-alkylacrylamide (the alkyl group has from 1 to 10 carbon atoms, such as methyl group, ethyl group, propyl group, butyl group, tert-butyl group, heptyl group, octyl group, cyclohexyl group and hydroxyethyl group), N,N-dialkylacrylamide (the alkyl group has from 1 to 10 carbon atoms, such as methyl group, ethyl group, butyl group, isobutyl group, ethylhexyl group and cyclohexyl group), N-hydroxyethyl-N-methylacrylamide and N-2-acetoamidoethyl-N-acetylacrylamide;

methacrylamides such as methacrylamide, N-alkylmethacrylamide (the alkyl group has from 1 to 10 carbon atoms, such as methyl group, ethyl group, tert-butyl group, ethylhexyl group, hydroxyethyl group and cyclohexyl group), N,N-dialkylmethacrylamide (the alkyl group includes an ethyl group, a propyl group and a butyl group) and N-hydroxyethyl-N-methylmethacrylamide;

allyl compounds such as allyl esters (e.g., allyl acetate, allyl caproate, allyl caprylate, allyl laurate, allyl palmitate, allyl stearate, allyl benzoate, allyl acetoacetate, allyl lactate) and allyloxyethanol;

vinyl ethers such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether);

vinyl esters such as vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-β-phenylbutyrate and vinyl cyclohexyl-carboxylate;

dialkyl itaconates (e.g., dimethyl itaconate, diethyl itaconate, dibutyl itaconate); dialkyl esters or monoalkyl esters of fumaric acid (e.g., dibutyl fumarate);

an acrylic acid, a methacrylic acid, a crotonic acid, an itaconic acid, a maleic anhydride, a maleimide, an acrylonitrile, a methacrylonitrile and a maleylonitrile.

Other than these, addition polymerizable unsaturated compounds copolymerizable with the above-described various repeating units may also be used.

The weight average molecular weight (as polystyrene by GPC method) of the phenol-based polymer (a) for use in the present invention is not particularly limited but in view of compatibility with the acid crosslinking agent as the component (c) and the thermal acid generator as the component (b), organic solvent property, film-forming property and the like, the weight average molecular weight is preferably from 1,000 to 1,000,000, more preferably from 2,000 to 100,000.

The phenol-based polymer (a) can be synthesized by a well-known method such as radical polymerization.

Specific examples of the copolymer for use in the present invention are set forth below, however, the present invention is not limited thereto. The numeral attached to the parenthesis shows a molar partial ratio.

P-1

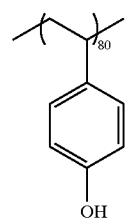

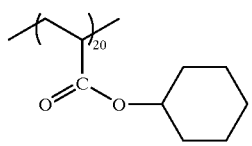

Mw = 18000

P-2

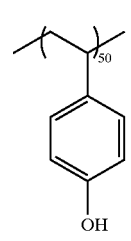

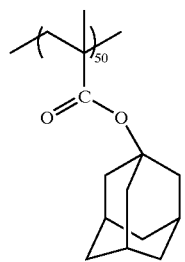

Mw = 12600

P-9

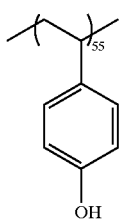 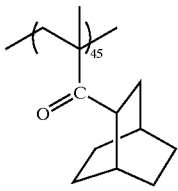

Mw = 22500

P-10

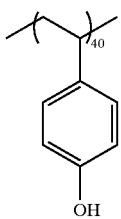 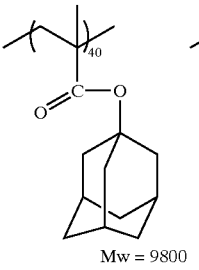 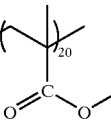

Mw = 9800

P-11

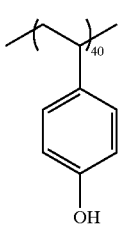 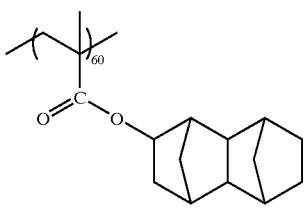

Mw = 19500

P-12

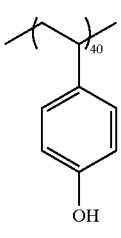 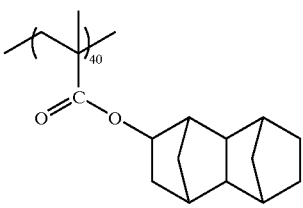

Mw = 13000

P-13

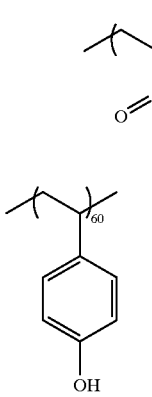 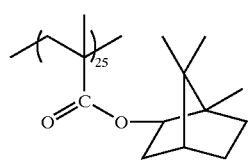 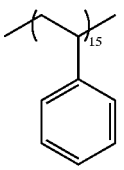

Mw = 17000

The novolak resin for use in the present invention can be obtained by addition-condensing a predetermined monomer as a main component to an aldehyde in the presence of an acidic catalyst. Examples of the predetermined monomer include phenol, cresols such as m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol and p-tertbutylphenol, trialkylphenols such as 2,3,5-trimethylphenol and 2,3,4-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol, and hydroxyaromatic compounds such as m-chlorophenol, p-chlorophenol, o-chlorophenol, dihydroxybiphenyl, bisphenol A, phenylphenol, resorcinol and naphthol. These compounds can be used individually or in combination of two or more thereof. The present invention is not limited thereto.

Examples of the aldehydes which can be used include formaldehyde, para-formaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-nbutylbenzaldehyde, furfural, chloroacetaldehyde and its acetal form such as chloroacetaldehydediethylacetal. Among these, formaldehyde is preferred. These aldehydes are used individually or in combination of two or more thereof. Examples of the acidic catalyst which can be used include hydrochloric acid, sulfuric acid, formic acid, acetic acid and oxalic acid.

Also, the techniques disclosed in JP-A-60-45238, JP-A-60-97347, JP-A-60-140235, JP-A-60-1189739, JP-A-64-142289, JP-A-1-276131, JP-A-2-60915, JP-A-2-275955, JP-A-2-282745, JP-A-4-101147 and JP-A-4-122938, namely, novolak resins from which a low molecular component is removed or reduced, are preferably used.

The weight average molecular weight of the thus-obtained novolak resin is preferably from 2,000 to 20,000. If the weight average molecular weight is less than 2,000, the film thickness loss in the unexposed area after development is large, whereas if it exceeds 20,000, the development rate decreases. The weight average molecular weight is more preferably from 3,000 to 15,000. The weight average molecular weight as used herein is a value in terms of polystyrene determined by gel permeation chromatography. The dispersion degree (the ratio of weight average molecular weight Mw to number average molecular weight Mn, namely, Mw/Mn) of the novolak resin is preferably from 1.5 to 7.0, more preferably from 1.5 to 4.0. If the dispersion degree exceeds 7, the effect of the present invention, that is, good film thickness dependency, cannot be attained, whereas if it is less than 1.5, a high-level purification step is necessary in the synthesis of novolak resin and this is not practicable.

The amount of the phenol-based polymer (a) used is usually from 70 to 98 wt %, preferably from 80 to 95 wt %, based on the solid content of the lower layer resist composition.

(b) Compound Capable of Generating Sulfonic Acid at a Temperature of 100° C. or More (Hereinafter Also Called a "Thermal Acid Generator")

The temperature where the thermal acid generator starts generating an acid is preferably from 150 to 220° C., more preferably from 170 to 200° C. The thermal acid generator is preferably a sulfonic acid ester compound or an iodonium salt of sulfonic acid.

The sulfonic acid ester compound is preferably a secondary or tertiary alcohol of sulfonic acid, more preferably a secondary or tertiary alcohol ester of sulfonic acid having from 5 to 25 carbon atoms. Examples thereof include secondary or tertiary alcohol esters of benzenesulfonic acid, such as 2-propanol, 2-butanol, tert-butanol, 2-pentanol, tert-pentanol and cyclohexanol, and p-toluenesulfonic acid esters.

The iodonium salt of sulfonic acid is preferably a diaryl iodonium salt compound. The diaryl iodonium salt compound is preferably a salt of diaryl iodonium cation and organic sulfonate anion.

Examples of the diaryl iodonium salt compound include the following compounds.

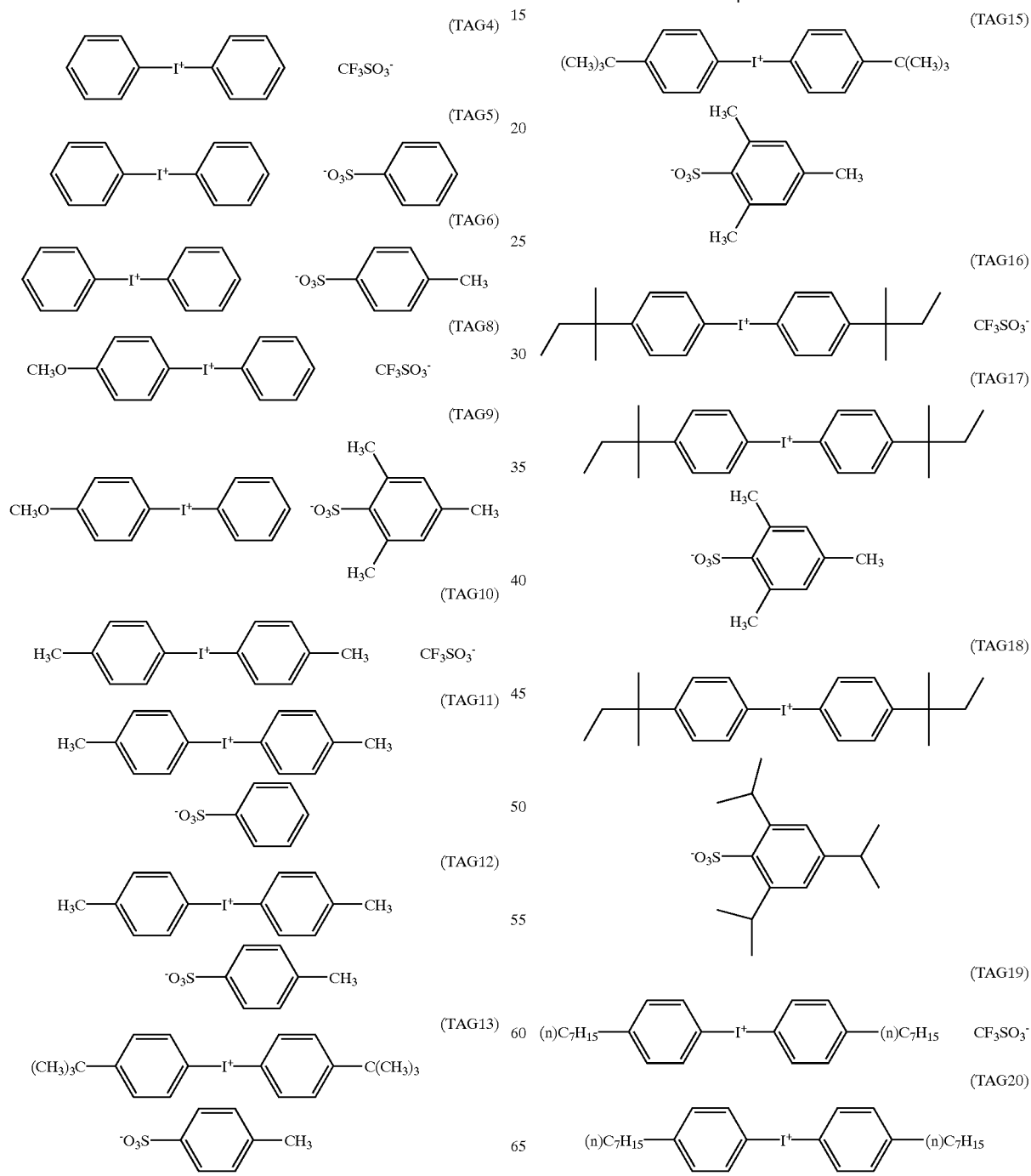

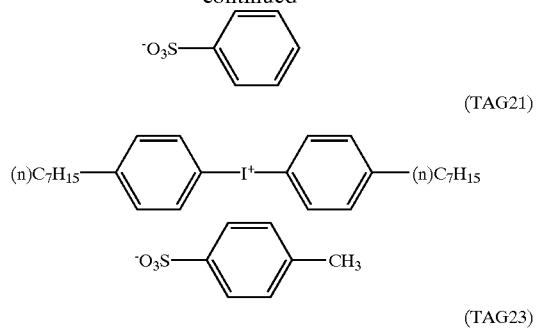

(TAG21)
(TAG23)
(TAG24)
(TAG25)
(TAG26)
(TAG27)
(TAG28)

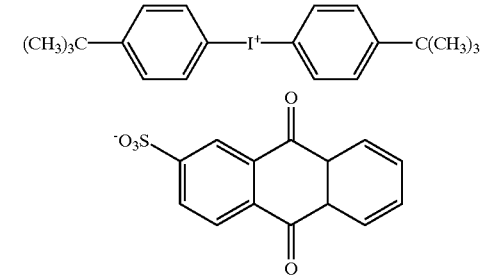

(TAG29)

Among these, a salt of diaryl iodonium and an organic sulfonic acid is preferred in view of stability and solvent solubility.

In particular, a salt of diaryl iodonium cation having a linear or branched alkyl group having from 1 to 12 carbon atoms or an alkoxy group having from 1 to 12 carbon atoms on the aryl group, and organic sulfonate anion is preferred also in view of safety.

Examples of the linear or branched alkyl group having from 1 to 12 carbon atoms and the alkoxy group having from 1 to 12 carbon atoms include a methyl group, an ethyl group, an n-propyl group, an i-propyl group, an n-butyl group, a sec-butyl group, an i-butyl group, a tert-butyl group, an n-amyl group, an i-amyl group, a tert-amyl group, an n-hexyl group, an n-heptyl group, an n-octyl group, a 2-ethylhexyl group, an n-decyl group, an n-dodecyl group, a cyclopropyl group, a cyclopentyl group, a cyclohexyl group, a methoxy group, an ethoxy group, a propoxy group and a butoxy group.

Examples of the aryl group include a phenyl group, a naphthyl group, an anthryl group and a phenanthryl group.

In view of solvent solubility, the organic sulfonate anion is preferably a trifluoromethane sulfonate, a methane sulfonate or an aryl sulfonate having a linear or branched alkyl group having from 1 to 12 carbon atoms, an alkoxy group having from 1 to 12 carbon atoms (examples of these alkyl group and alkoxy group are the same as those described above) or a halogen atom as a substituent on the aryl group. Examples of the aryl group are the same as those described above.

These thermal acid generators can be used individually or in combination of two or more thereof.

The thermal acid generator is usually blended at a ratio of 0.5 to 10 parts by weight, preferably from 1 to 5 parts by weight, per 100 parts by weight (as solid content) of the lower layer resist composition.

(c) Phenol-based Acid Crosslinking Agent Having Two or More Benzene Rings and Capable of Crosslinking with the Polymer Under the Action of an Acid The phenol-based acid crosslinking agent for use in the present invention is a compound having two or more benzene rings within the molecule and is preferably a phenol derivative where at least one hydroxymethyl group and at least one alkoxymethyl group are further contained and these hydroxymethyl group and alkoxymethyl group are bonded concentratedly or dividedly to at least some benzene rings.

The alkoxymethyl group bonded to the benzene ring is preferably an alkoxymethyl group having 6 or less carbon atoms. Specifically, a methoxymethyl group, an ethoxymethyl group, an n-propoxymethyl group, an i-propoxymethyl group, an n-butoxymethyl group, an i-butoxymethyl group, a sec-butoxymethyl group and a tert-butoxymethyl group are preferred.

As the phenol-based acid crosslinking agent for use in the present invention, a compound having two or more benzene rings and also having an alkoxy-substituted alkoxy group is also preferred. Examples of the alkoxy-substituted alkoxy group include 2-methoxyethoxy group and 2-methoxy-1-propoxy group.

Among these phenol derivatives, particularly preferred compounds are set forth below.

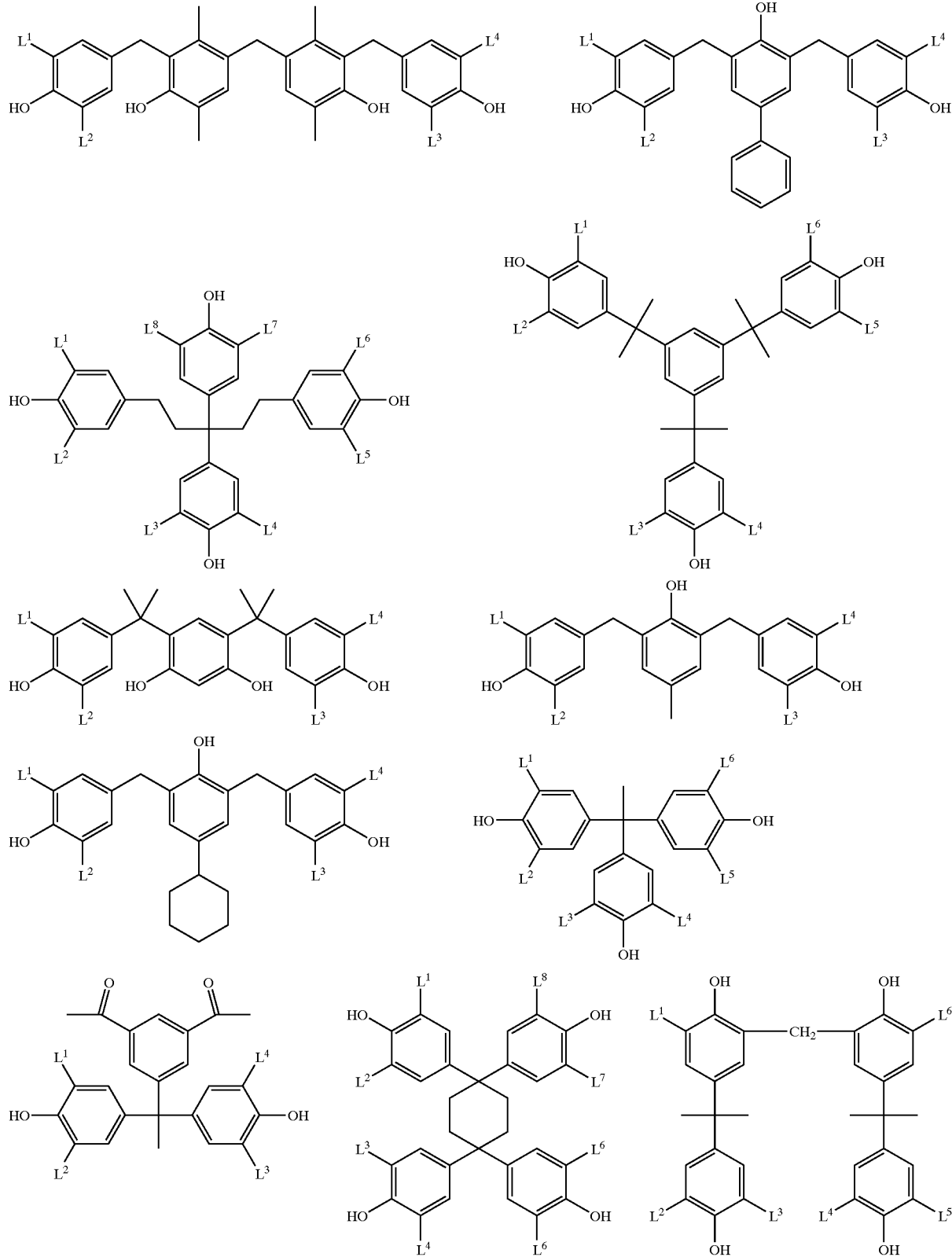

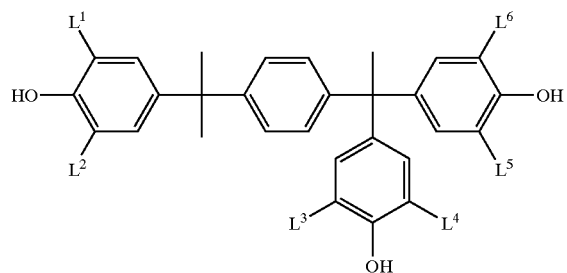
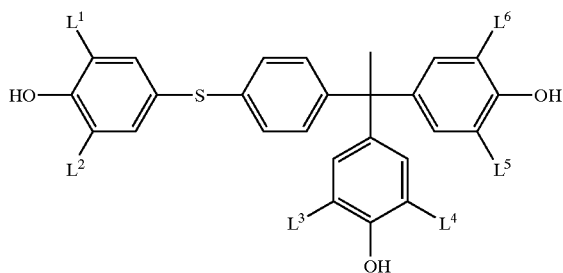
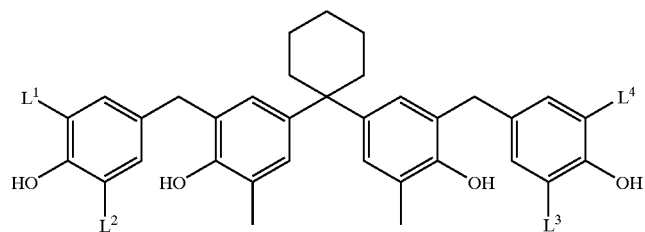
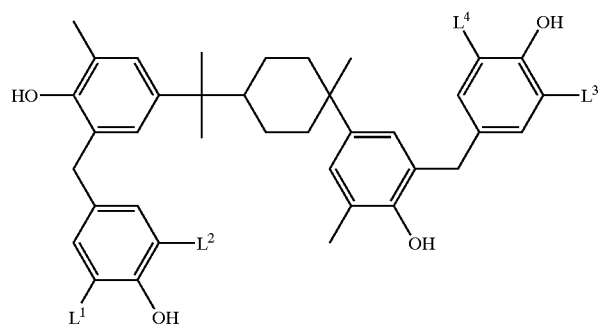
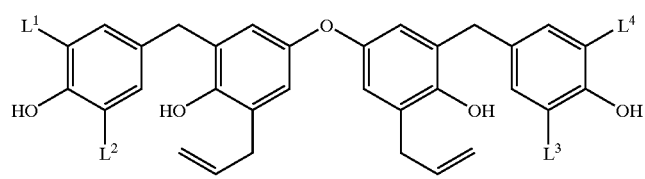
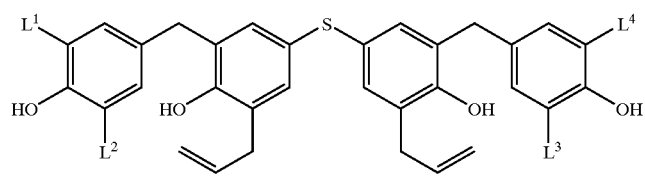
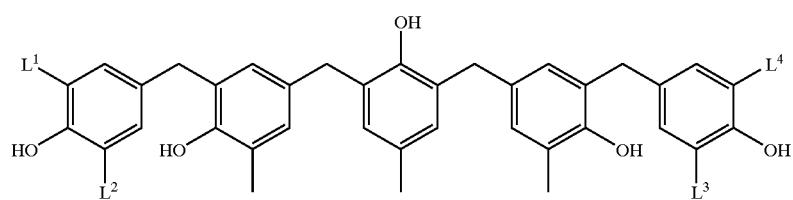

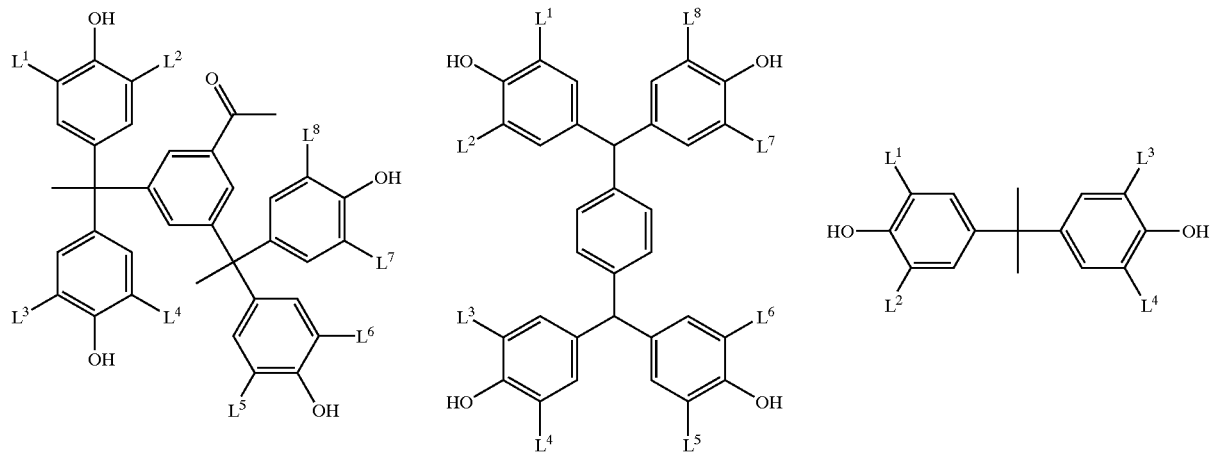

In these formulae, $L_1$ to $L_8$, which may be the same or different, each represents a hydroxymethyl group, a methoxymethyl group or an ethoxymethyl group. Each compound has at least one hydroxymethyl group and at least one methoxymethyl or ethoxymethyl group.

The crosslinking agent for use in the present invention is synthesized by partially alkoxymethylating a phenol derivative having a hydroxymethyl group, which is an intermediate. The phenol derivative having a hydroxymethyl group can be obtained by reacting a corresponding phenol derivative not having a hydroxymethyl group (a compound where in formulae above, $L_1$ to $L_8$ are a hydrogen atom) with formaldehyde in the presence of a basic catalyst. At this time, the reaction is preferably performed at a temperature of 60° C. or less so as to prevent resinification or gelling. Specifically, the synthesis method described in JP-A-6-282067 and JP-A-7-64285 can be used.

The partial alkoxymethylation can be performed by reacting a corresponding phenol derivative having a hydroxymethyl group and an alcohol in the presence of an acid catalyst. At this time, the reaction is preferably performed at a temperature of 100° C. or less so as to prevent resinification or gelling. Specifically, the synthesis method described in EP-A-632003 can be used.

The conversion rate from the methylol group of the intermediate to the alkoxymethyl group is, as a mixture, from 20 to 98%, preferably from 30 to 96%, more preferably from 50 to 95% (as measured by NMR). The content of the compound where all methylol groups are completely displaced by an alkoxymethyl group is from 20 to 96%, preferably from 50 to 93%, more preferably from 60 to 90% (as measured by HPLC).

These phenol derivatives where one or more hydroxymethyl group and one or more alkoxymethyl group are contained and bonded concentratedly or dividedly to some benzene rings may be used individually or in combination of two or more.

In the phenol-based acid crosslinking agent for use in the present invention, the number of benzene rings is preferably from 2 to 10, more preferably from 3 to 6, most preferably 3 to 5.

The amount of this phenol derivative added is from 3 to 70 wt %, preferably from 5 to 50 wt %, based on the solid content of the lower layer resist composition. If the amount added of the phenol derivative as a crosslinking agent is less than 3 wt %, the film residual ratio decreases, whereas if it exceeds 70 wt %, the resolution lowers and moreover, this is not preferred in view of the stability during storage of the resist solution.

In the present invention, for example, another crosslinking agent (i) or (ii) shown below may be used in combination with the above-described phenol derivative.

The ratio of the phenol derivative to another crosslinking agent which can be used in combination is from 100/0 to 20/80 by mol, preferably from 90/10 to 40/60 by mol, more preferably from 80/20 to 50/50 by mol.

(i) A compound having an N-hydroxymethyl group, an N-alkoxymethyl group or an N-acyloxymethyl group.

(ii) An epoxy compound.

These crosslinking agents are described in detail below.

Examples of (i) the compound having an N-hydroxymethyl group, an N-alkoxymethyl group or an N-acyloxymethyl group include monomer or oligomer-melamine-formaldehyde condensates and urea-formaldehyde condensates disclosed in EP-A-0133216 and West German Patents 3,634,671 and 3,711,264, and benzoguanamine-formaldehyde condensates disclosed in EP-A-0212482.

Preferred examples thereof include melamine-formaldehyde derivatives having at least two free N-hydroxymethyl, N-alkoxymethyl or N-acyloxymethyl groups. Among these, N-alkoxymethyl derivatives are more preferred.

Examples of (ii) the epoxy compound include monomer-, dimer-, oligomer- or polymer-form epoxy compounds containing one or more epoxy group. Specific examples thereof include a reaction product of bisphenol A and epichlorohydrin, and a reaction product of low molecular weight phenol-formaldehyde resin and epichlorohydrin. In addition, epoxy resins described and used in U.S. Pat. No. 4,026,705 and British Patent 1,539,192 may also be used.

(d) Solvent

The solvent is described below. Examples of the solvent which can be preferably used for the formation of the lower layer resist composition of the present invention include ethylene glycol monoethyl ether acetate, cyclohexanone, 2-heptanone, propylene glycol monomethyl ether, propylene glycol monomethyl ether acetate, propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate and ethylene carbonate.

These solvents are used individually or in combination. The selection of the solvent is important because the solubility for respective components of the lower layer resist composition, the storage stability and the like are affected. The water content contained in the solvent affects various performances of the resist and therefore, is preferably smaller.

The components constituting the lower resist composition of the present invention are preferably dissolved in the above-described solvent to a concentration, as a solid concentration, of 3 to 40 wt %, more preferably from 5 to 30 wt %, still more preferably from 7 to 20 wt %, to prepare a coating solution.

The lower layer resist composition of the present invention may further contain, if desired, other components such as nitrogen-containing compound, surfactant, dye and radical generator.

(e) Nitrogen-containing Compound

The nitrogen-containing compound which can be used in the present invention is preferably a nitrogen-containing compound having stronger basicity than phenol.

Preferred examples of the chemical structure include the structures represented by the following formulae (A) to (E):

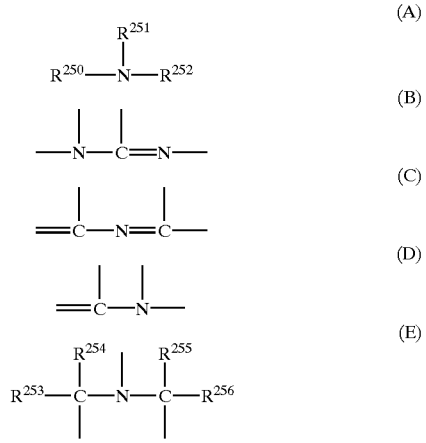

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, and $R^{251}$ and $R^{252}$ may combine with each other to form a ring; and $R^{253}$, $R^{254}$, $R^{255}$ and $R^{256}$, which may be the same or different, each represents an alkyl group having from 1 to 6 carbon atoms.

The compound is more preferably a nitrogen-containing basic compound having two or more nitrogen atoms different in the chemical structure within one molecule, still more preferably a compound having both a ring structure containing a substituted or unsubstituted amino group and a ring structure containing a nitrogen atom, or a compound having an alkylamino group.

Specific preferred examples of the compound include substituted or unsubstituted guanidine, substituted or unsubstituted aminopyridine, substituted or unsubstituted aminoalkylpyridine, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

More preferred examples of the compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)-pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methyl-pyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)-morpholine.

These nitrogen-containing compounds are used individually or in combination of two or more thereof.

The content of the nitrogen-containing compound is preferably from 0.001 to 2 wt %, more preferably from 0.005 to 1 wt %, based on the solid content of the lower layer resist composition.

(f) Surfactant

The surfactant which can be blended in the lower layer resist composition of the present invention is preferably a fluorine-containing surfactant and/or a silicon-containing surfactant. A fluorine-containing surfactant, a silicon-containing surfactant and a surfactant containing both a fluorine atom and a silicon atom can be used individually or in combination of two or more thereof.

Examples of the surfactant include the surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988. Also, the following commercially available surfactants can be used as it is.

Examples of commercially available surfactants which can be used include fluorine-containing surfactants and silicon-containing surfactants such as Eftop EF301, EF303 (produced by Shin-Akita Kasei K.K.), Florad FC430, 431 (produced by Sumitomo 3M Inc.), Megafac F171, F173, F176, F189, R08 (produced by Dainippon Ink & Chemicals Inc.), Surflon S-382, SC101, 102, 103, 104, 105, 106 (produced by Asahi Glass Co., Ltd.) and Troysol S-366 (produced by Troy Chemical K.K.). Also, polysiloxane polymer KP-341 (produced by Shin-Etsu Chemical Co., Ltd.) can be used as the silicon-containing surfactant.

The amount of the surfactant blended is usually from 0.001 to 2 wt %, preferably from 0.01 to 1 wt %, based on the solid content of the lower layer resist composition. These surfactants can be used individually or in combination.

Examples of the surfactant which can be additionally used include a nonionic surfactant and specific examples thereof include polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ether s such as polyoxyethylene octyl phenol ether and polyoxyethylene nonyl phenol ether, polyoxyethylene.polyoxypropylene block copolymers, sorbitol fatty acid esters such as sorbitol monolaurate, sorbitol monopalmitate, sorbitol monostearate, sorbitol monooleate, sorbitol trioleate and sorbitol tristearate, and polyoxyethylene sorbitol fatty acid esters such as polyoxyethylene sorbitol monolaurate, polyoxyethylene sorbitol monopalmitate, polyoxyethylene sorbitol monostearate, polyoxyethylene sorbitol trioleate and polyoxyethylene sorbitol tristearate.

The amount of the additional surfactant blended is usually 2 parts by weight or less, preferably 1 part by weight or less, per 100 parts by weight of the solid content of the lower layer resist composition.

(g) Dye

The dye is suitably an oily dye or a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Kagaku Kogyo K.K.), Crystal Violet (CI 42555), Methyl Violet (CI 42535), Rhodamine B (CI 45170B), Malachite Green (CI 42000) and Methylene Blue (CI 52015).

(h) Radical Generator

In the lower layer resist composition of the present invention, a radical generator may be used in combination, if desired. For this radical generator, well-known radical polymerization initiators generally used for the reaction of synthesizing a polymer by radical polymerization can be used without any particular limitation. Examples thereof include azobisnitrile-based compounds such as 2,2'-azobisisobutyronitrile and 2,2'-azobispropionitrile; organic peroxides such as benzoyl peroxide, lauroyl peroxide, acetyl peroxide, tert-butyl perbenzoate, α-cumyl hydroperoxide, di-tert-butyl peroxide, diisopropyl peroxydicarbonate, tert-butyl peroxyisopropylcarbonate, peracids, alkyl peroxycarbamates and nitrosoarylacylamines; inorganic peroxides such as potassium persulfate, ammonium persulfate and potassium perchlorate; azo- or diazo-type compounds such as diazoaminobenzene, p-nitrobenzene diazonium, azobis-substituted alkanes, diazo thioethers and aryl azosulfones; nitrosophenylurea; tetraalkyl thiuram disulfides such as tetramethyl thiuram disulfide; diaryl disulfides such as dibenzoyl disulfide; dialkyl xanthogenic acid disulfides; arylsulfinic acids; aryl alkylsulfones; and 1-alkanesulfinic acids.

The activation energy of the radical generator for generating a radical is preferably 30 Kcal/mol or more. Examples of such a radical generator include azobisnitrile-based compounds and organic peroxides. In particular, a compound having excellent stability at an ordinary temperature, exhibiting a high decomposition rate under heating and becoming colorless at the decomposition is preferred and examples thereof include benzoyl peroxide and 2,2'-azobisisobutyronitrile.

These radical generators may be used individually or in combination of two or more and the amount of the radical generator used is approximately from 0.5 to 30 wt %, preferably from 2 to 10 wt %, based on the entire solid content of the lower layer resist composition.

The lower layer resist composition for a silicon-containing two-layer resist of the present invention is used in combination with a silicon-containing upper layer resist. As for the silicon-containing upper layer resist composition, both a positive type and a negative type can be preferably used and specific examples thereof include well-known silicon-containing resist composition described in the "Background of the Invention".

The lower layer resist composition for a silicon-containing two-layer resist of the present invention is coated on a substrate by spin coating, spray coating or the like as a step of forming the lower (layer) resist layer. In this case, the film thickness of the lower resist layer is preferably from 0.1 to 2.0 μm, more preferably from 0.2 to 1.5 μm, still more preferably from 0.25 to 1.2 μm. If the thickness is less than 0.1 μm, this is not preferred in view of antireflection or dry etching resistance, whereas if it exceeds 2.0 μm, the aspect ratio becomes excessively high and the pattern formed readily falls down.

Before the subsequent formation of a silicon-containing upper resist layer, the lower resist layer is preferably heat-treated. The heat treatment temperature is preferably from 150 to 300° C., more preferably from 170 to 250° C., still more preferably from 180 to 230° C. If the temperature is less than 150° C., the upper resist layer readily undertakes intermixing with the lower resist layer at the time of coating the upper resist layer and this is not preferred, whereas if the temperature exceeds 300° C., the polymer in the lower layer resist readily undertakes a decomposition reaction and this is also not preferred.

The heat treatment time varies depending on the heat treatment temperature but in the case of a heat treatment at 180 to 230° C., the heat treatment time is preferably from 10 to 1,000 seconds, more preferably from 20 to 600 seconds. If the heat treatment time is less than 10 seconds, heat curing insufficiently proceeds and intermixing with the upper resist layer readily occurs, whereas if it exceeds 1,000 seconds, the number of sheets of the substrate treated disadvantageously decreases.

As a step of forming the upper (layer) resist layer, the upper (layer) resist layer is provided by coating the upper layer resist composition on the lower (layer) resist layer and then patterning is performed. In the step of forming the pattern, various high energy rays may be irradiated but in particular, g-line, h-line, i-line, excimer laser light (e.g., KrF, ArF, F2), electron beam, X ray, molecular ray and ion beam are preferred. After the subsequent development with an alkali aqueous solution, a pattern is formed.

In the second stage, dry etching is performed. This operation is performed by oxygen plasma etching using the pattern of the resist composition film as the mask, whereby a fine pattern having a high aspect ratio is formed. At this time, the oxygen gas may be mixed with a gas such as nitrogen gas, Ar gas, sulfurous acid gas, chlorine gas or fluorine gas.

EXAMPLE

The present invention is described in greater detail below by referring to Synthesis Examples, Examples and Comparative Examples, however, the present invention should not be construed as being limited to the following Examples.

Synthesis Example 1

Synthesis of Polymer P-2 for Lower Layer:
Synthesis of Monomer

In 70 ml of acetone, 10.6 g of methacrylic acid chloride, 15 g of 1-adamantanol and 0.5 g of methoxy-hydroquinone were dissolved. Thereto, 10.3 g of triethylamine was added dropwise and after allowing the reaction to proceed at 60° C. for 4 hours, 0.5 liter of distilled water was added. The product was collected by decantation and purified by silica gel chromatography. The yield was 85%.

Synthesis of Polymer

In 100 g of DMF, 13.3 g of the monomer prepared above and 6.0 g of p-hydroxystyrene were dissolved. The reaction solution was heated at 65° C. and at the same time, nitrogen was passed into the reaction solution for 30 minutes. Every 2 hours, 35 mg of V-65 (produced by Wako Pure Chemical Industries, Ltd.) as a polymerization initiator was added three times. The reactant was reprecipitated in 1 liter of distilled water, whereby P-2 was recovered as a powder material. The obtained polymer was analyzed by GPC, as a result, the weight average molecular weight in terms of standard polystyrene was 12,600.

Synthesis Example 2

Synthesis of Polymer P-4 for Lower Layer

Synthesis of Polymer

In 100 g of DMF, 13.3 g of isobornyl methacrylate and 4.8 g of p-hydroxystyrene were dissolved. The reaction solution was heated at 65° C. and at the same time, nitrogen was passed into the reaction solution for 30 minutes. Every 2 hours, 50 mg of V-65 (produced by Wako Pure Chemical Industries, Ltd.) as a polymerization initiator was added three times. The reactant was reprecipitated in 1 liter of distilled water, whereby P-4 was recovered as a powder material. The obtained polymer was analyzed by GPC, as a result, the weight average molecular weight in terms of standard polystyrene was 18,000.

Synthesis Example 3

Synthesis Example 3-1

Synthesis of Intermediate [HM-1]

To an aqueous 10% potassium hydroxide solution, 20 g of 1-[α-methyl-α-(4-hydroxyphenyl)ethyl]-4-[α,α-bis(4-hydroxyphenyl)ethyl]benzene (Trisp-PA, produced by Honshu Kagaku Kogyo K.K.) was added, stirred and dissolved. While stirring this solution, 60 ml of an aqueous 37% formalin solution was gradually added at room temperature over 1 hours. The solution was further stirred at room temperature for 6 hours and then poured into an aqueous solution of dilute sulfuric acid. The precipitate was filtered, thoroughly washed with water and recrystallized from 30 ml of methanol, as a result, 20 g of a phenol derivative having a hydroxymethyl group {HM-1] of the structure shown below was obtained as white powder. The purity was 92% (by liquid chromatography)

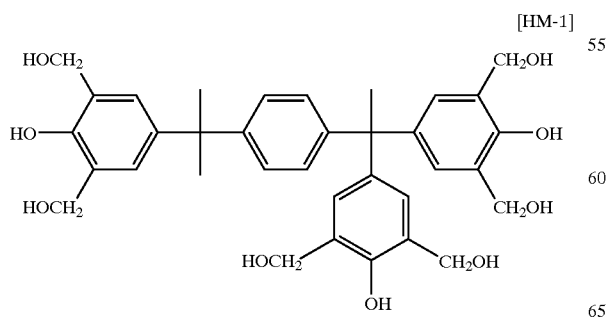

[HM-1]

Synthesis Example 3-2

Synthesis of Crosslinking Agent [HMM-1]

To 1 liter of methanol, 20 g of the phenol derivative having a hydroxymethyl group [HM-1] obtained above was added, stirred under heating and dissolved. To this solution, 1 ml of concentrated sulfuric acid was added and refluxed under heating for 12 hours. After the completion of reaction, the reaction solution was cooled and thereto, 2 g of potassium carbonate was added. This mixture was thoroughly concentrated and thereto, 300 ml of ethyl acetate was added. The resulting solution was washed with water, concentrated and dried to a solid to obtain 22 g of a crosslinking agent [HMM-1] as a white solid, where 90% of hydroxymethyl group in the intermediate [HM-1] was methoxylated. The purity was 90% (by liquid chromatography).

The following crosslinking agents were synthesized in the same manner.

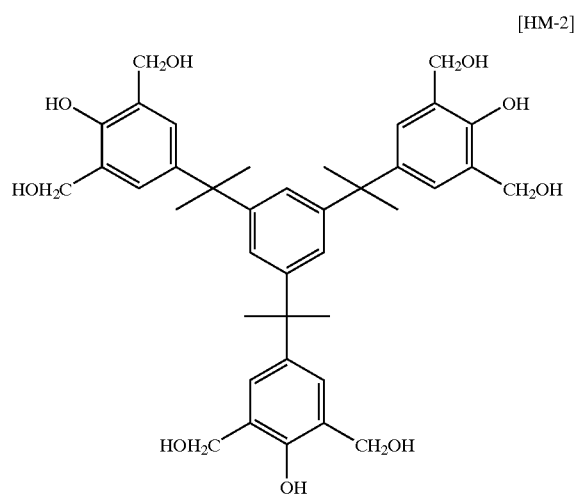

[HM-2]

A crosslinking agent [HMM-2] where 84% of hydroxymethyl group in the intermediate [HM-2] was methoxylated was obtained.

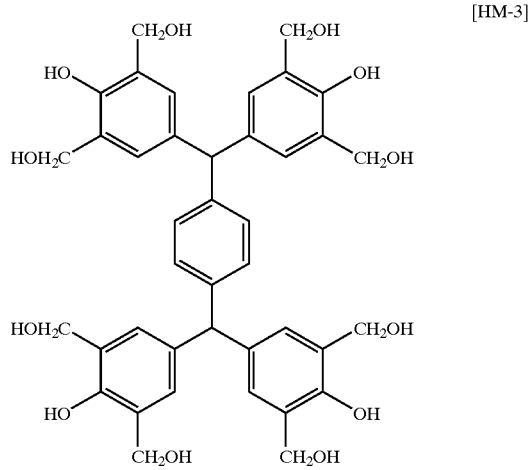

[HM-3]

A crosslinking agent [HMM-3] where 80% of hydroxymethyl group in the intermediate [HM-3] was methoxylated was obtained.

[HM-4]

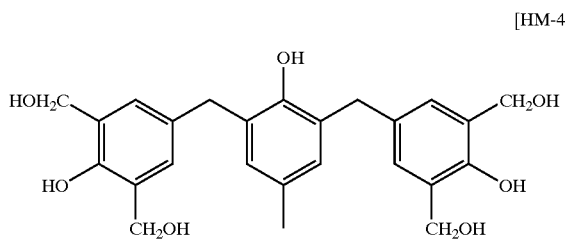

A crosslinking agent [HMM-4] where 88% of hydroxymethyl group in the intermediate [HM-4] was methoxylated was obtained.

[HM-5]

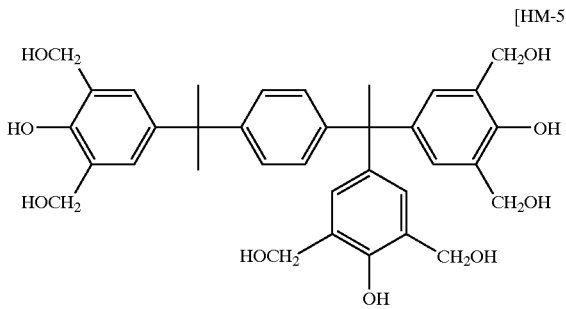

A crosslinking agent [HMM-5] where 85% of hydroxymethyl group in the intermediate [HM-5] was methoxylated was obtained.

Example 1

| (1) Preparation of Lower Layer Resist Composition | |
| --- | --- |
| Component (a): P-2 prepared above | 5.0 g |
| Component (b): Di(tert-amyl)phenyl-iodonium-2,4,6-triisopropyl sulfonate (B-1) | 0.125 g |
| Component (c): HMM-1 prepared above | 1.0 g |
| Fluorine-containing surfactant(W-1): Megafac F176 (Dainippon Ink & Chemicals Inc.) | 0.001 g |

These were dissolved in a mixed solvent of 25.0 g of propylene glycol monomethyl ether acetate and 10.0 g of propylene glycol monomethyl ether and the obtained solution was precision-filtered through a membrane filter having an aperture of 0.1 μm to obtain a lower layer resist composition (coating solution).

| (2) Preparation of Silicon-Containing Upper Layer Resist Composition | |
| --- | --- |
| Resin 2 shown below | 0.9 g |
| (B-4) shown below | 0.05 g |

These and additionally, 0.005 g of 1,5-diazabicyclo [4.3.0]-5-nonene as a nitrogen-containing basic compound and 0.001 g of Megafac F176 (Dainippon Ink & Chemicals Inc) as a surfactant were dissolved in 9 g of methoxypropyl acetate and the obtained solution was precision-filtered through a membrane filter having an aperture of 0.1 μm to obtain a silicon-containing upper layer resist composition.

(Resin 2)

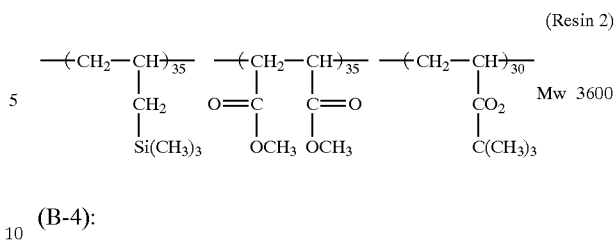

(B-4):

Triphenylsulfonium-2,4,6-triisopropylphenyl sulfonate

The lower layer resist composition obtained was coated on a 6-inch silicon wafer using a spin coater Mark 8 manufactured by Tokyo Electron and heated at 90° C. for 90 seconds to obtain a uniform film having a film thickness of 0.55 μm. This film was further heated at 200° C. for 90 seconds to obtain a lower resist layer having a film thickness of 0.40 μm.

On this lower resist layer, the silicon-containing upper layer resist composition was coated in the same manner and heated at 130° C. for 90 seconds to obtain an upper resist layer having a film thickness of 0.20 μm.

The thus-obtained wafer was exposed while varying the exposure amount by loading a resolution mask on ArF Excimer Stepper 9300 manufactured by ISI.

Then, the wafer was heated at 120° C. for 90 seconds in a clean room, developed with a tetrahydroammonium hydroxide developer (2.38%) for 60 seconds, rinsed with distilled water and dried to obtain a pattern (upper layer pattern). Subsequently, the wafer having the upper layer pattern was etched (dry-developed) using a parallel plate-type reactive ion etching apparatus DES-245R manufactured by Plasma System to form a pattern on the lower layer. The etching gas was oxygen, the pressure was 20 mTorr, the applied power was 100 mW/cm² and the substrate temperature was 10° C.

The pattern shape, dry etching resistance and film thickness uniformity were evaluated by the following methods.

(1) Pattern Shape

In the pattern cross-sectional shape of the upper layer resist at the patterning with an exposure amount necessary for reproducing 0.15 μm line/space of the mask, the degree of footing/scumming was evaluated as follows by a scanning-type electron microscope.

| Rank A: | Almost no footing/scumming |
| --- | --- |
| Rank B: | Slight footing/scumming |
| Rank C: | Serious footing/scumming |

(2) Dry Etching Resistance

The lower layer resist composition was coated on a 6-inch silicon wafer by a spin coater, heated at 90° C. for 90 seconds and further heated at 200° C. for 90 seconds to obtain a lower resist layer. The substrate was etched under the following conditions and the etching rate was determined by the observation through a scanning-type electron microscope. The evaluation was made by a relative rate based on the rate when i-line resist (FHi-635) was used.

Etching Apparatus:

Parallel plate-type reactive ion etching apparatus DES-245R manufactured by Plasma System

| Etching gas: | CF4/02 (40/10), 100 sccm |
| Pressure: | 12 mTorr |
| Power applied | 150 W |
| Substrate temperature: | 10° C. |

(3) Film Thickness Uniformity

The lower resist layer obtained in the same manner as in (2) above was measured on the film thickness at 25 points on the crosswise center line of the wafer from one end to another end of the wafer and the film thickness distribution was determined by 3σ.

In Example 1, good results were obtained, specifically, the pattern shape was Rank A, the dry etching rate (relative rate) was 1.05 and the film thickness uniformity (3σ) was 43 nm.

Examples 2 to 20

Lower layer resist compositions were prepared by using components (a), (b) and (c) and surfactant shown in Table 1 in place of the components (a), (b) and (c) and surfactant of Example 1 and if desired, newly adding a nitrogen-containing compound. The pattern shape, dry etching resistance and film thickness uniformity were evaluated in the same manner as in Example 1. The results are shown in Table 2. The polymer, thermal acid generator, surfactant and nitrogen-containing compound used are shown below.

Polymer (P2-1): m,p-cresol novolak resin
Polymer (P2-2):
  p-hydroxystyrene (Mw=15,000) (produced by Nippon Soda Co., Ltd.)
Thermal acid generator (B-1):
  di(tert-amyl)phenyliodonium-2,4,6-triisopropyl sulfonate
Fluorine-containing surfactant (W-1):
  Megafac F176 (Dainippon Ink & Chemicals Inc.)
Silicon-containing surfactant (W-2):
  polysiloxane polymer KP341 (produced by Shin-Etsu Chemical Co., Ltd.)
Nitrogen-containing compound (D-1):
  2-phenylbenzimidazole
Nitrogen-containing compound (D-2):
  1,5-diazabicyclo[4.3.0]-5-nonene

Comparative Examples 1 to 3

Lower layer resist compositions were prepared in the same manner as in Example 1 except for using the crosslinking agent shown below in place of the crosslinking agent as the component (c) of Example 1. The pattern shape, dry etching resistance and film thickness uniformity were evaluated in the same manner as in Example 1. The results are shown in Table 2.

| Crosslinking agent (C2-1): | hexamethylolmelamine |
| Crosslinking agent (C2-2): | butanediol-di-glycidyl ether |
| Crosslinking agent (C2-3): | 2,6-dihydroxymethyl-p-cresol |

TABLE 1

| Example | Polymer | Thermal Acid Generator | Cross-linking Agent | Nitrogen-Containing Compound | Surfactant |
|---|---|---|---|---|---|
| 1 | P-2(5.0) | B-1(0.125) | HMM-1(1.0) | — | W-1(0.001) |
| 2 | P-2(5.0) | B-1(0.125) | HMM-2(1.0) | D-1(0.005) | — |
| 3 | P-2(5.0) | B-1(0.125) | HMM-3(1.0) | — | W-1(0.001) |
| 4 | P-2(5.0) | B-1(0.125) | HMM-4(1.0) | — | W-1(0.001) |
| 5 | P-3(5.0) | B-2(0.125) | HMM-1(1.0) | D-2(0.003) | — |
| 6 | P-3(5.0) | B-2(0.125) | HMM-2(1.0) | — | — |
| 7 | P-3(5.0) | B-2(0.125) | HMM-3(1.0) | — | W-1(0.001) |
| 8 | P-4(5.0) | B-1(0.125) | HMM-1(1.0) | D-1(0.005) | W-2(0.001) |
| 9 | P-4(5.0) | B-1(0.125) | HMM-2(1.0) | — | W-2(0.001) |
| 10 | P-4(5.0) | B-1(0.125) | HMM-3(1.0) | — | W-1(0.001) |
| 11 | P-11(5.0) | B-2(0.125) | HMM-1(1.0) | D-1(0.005) | W-1(0.001) |
| 12 | P-11(5.0) | B-2(0.125) | HMM-2(1.0) | — | W-1(0.001) |
| 13 | P-11(5.0) | B-1(0.125) | HMM-3(1.0) | — | — |
| 14 | P-13(5.0) | B-1(0.125) | HMM-1(1.0) | D-2(0.003) | W-1(0.001) |
| 15 | P-13(5.0) | B-1(0.125) | HMM-2(1.0) | — | — |
| 16 | P-13(5.0) | B-2(0.125) | HMM-3(1.0) | — | W-1(0.001) |
| 17 | P2-1(5.0) | B-1(0.125) | HMM-1(1.0) | D-2(0.003) | W-2(0.001) |
| 18 | P2-1(5.0) | B-2(0.125) | HMM-2(1.0) | — | W-1(0.001) |
| 19 | P2-2(5.0) | B-1(0.125) | HMM-5(1.0) | — | W-2(0.001) |
| 20 | P2-2(5.0) | B-2(0.125) | HMM-5(1.0) | D-1(0.005) | W-1(0.001) |
| Comparative Example 1 | P-2(5.0) | B-1(0.125) | C2-1(1.0) | — | W-1(0.001) |
| Comparative Example 2 | P-2(5.0) | B-1(0.125) | C2-2(1.0) | — | W-1(0.001) |
| Comparative Example 3 | P-2(5.0) | B-1(0.125) | C2-3(1.0) | — | W-1(0.001) |

TABLE 2

| Example | Pattern Shape (3 rank evaluation) | Dry Etching Resistance (relative evaluation) | Film Thickness Uniformity (nm: 3σ evaluation) |
|---|---|---|---|
| 1 | A | 1.05 | 43 |
| 2 | A | 1.04 | 31 |
| 3 | A | 1.07 | 52 |
| 4 | A | 1.03 | 40 |
| 5 | A | 1.05 | 28 |
| 6 | A | 1.05 | 36 |
| 7 | B | 1.05 | 33 |
| 8 | A | 1.10 | 45 |
| 9 | A | 1.06 | 50 |
| 10 | A | 1.05 | 41 |
| 11 | A | 1.08 | 35 |
| 12 | A | 1.02 | 37 |
| 13 | A | 1.11 | 30 |
| 14 | A | 1.06 | 47 |
| 15 | A | 1.09 | 50 |
| 16 | A | 1.06 | 32 |
| 17 | A | 1.00 | 60 |
| 18 | B | 1.01 | 55 |

TABLE 2-continued

| Example | Pattern Shape (3 rank evaluation) | Dry Etching Resistance (relative evaluation) | Film Thickness Uniformity (nm: 3σ evaluation) |
|---|---|---|---|
| 19 | A | 1.02 | 41 |
| 20 | B | 1.03 | 50 |
| Comparative Example 1 | A | 1.30 | 75 |
| Comparative Exam-le 2 | B | 1.25 | 85 |
| Comparative Example 3 | A | 1.20 | 120 |

As seen from Table 2, the lower layer resist composition for a silicon-containing two-layer resist according to the present invention exhibits excellent dry etching resistance for a substrate and provides a coating excellent in the film thickness uniformity.

The lower layer resist composition for a silicon-containing two-layer resist of the present invention can respond to exposure in the far ultraviolet region and allows the formation of a silicon-containing upper layer pattern having a good shape. The dry etching resistance for the substrate is also excellent. Furthermore, the film thickness uniformity of the coating is excellent.

Accordingly, the lower layer resist composition for a silicon-containing two-layer resist of the present invention is very suitable as a lower layer resist of a silicon-containing two-layer resist used in the mass production of a semiconductor substrate having an ultrafine circuit.

The entitle disclosure of each and every foreign patent application from which the benefit of foreign priority has been claimed in the present application is incorporated herein by reference, as if fully set forth herein.

While the investigation has been described in detail and with reference to specific embodiments thereof, it will be apparent to one skilled in the art that various changes and modification can be made therein without departing from the spirit and scope thereof.

What is claimed is:

1. A lower layer resist composition for a silicon-containing two-layer resist, comprising:
   (a) a phenol-based polymer,
   (b) a compound capable of generating a sulfonic acid at a temperature of 100° C. or more,
   (c) a phenol-based acid crosslinking agent having two or more benzene rings and capable of crosslinking with said polymer under the action of an acid, and
   (d) a solvent.

2. The lower layer resist composition for a silicon-containing two-layer resist as claimed in claim 1, wherein the phenol-based polymer is at least one member selected from a novolak resin and a homopolymer or copolymer having a polyvinyl phenol site.

3. The lower layer resist composition for a silicon-containing two-layer resist as claimed in claim 1, wherein the phenol-based polymer is a copolymer having a polyvinyl phenol site and at a side chain at least one group selected from the group consisting of a chain hydrocarbon group, an alicyclic hydrocarbon group and a bridged alicyclic hydrocarbon group.

4. The lower layer resist composition for a silicon-containing two-layer resist as claimed in claim 1, wherein the phenol-based acid crosslinked agent has from 3 to 5 benzene rings.

5. The lower layer resist composition for a silicon-containing two-layer resist as claimed in claim 1, wherein the compound capable of generating a sulfonic acid is at least one member selected from a secondary or tertiary alcohol ester of sulfonic acid and an iodonium salt of sulfonic acid.

6. The lower layer resist composition for a silicon-containing two-layer resist as claimed in claim 1, which further contains a nitrogen-containing compound.

7. The lower layer resist composition for a silicon-containing two-layer resist as claimed in claim 1, which further contains a surfactant.

8. A pattern-forming method which comprises steps:
   coating on a substrate a lower layer resist composition for a silicon-containing two-layer resist, comprising (a) a phenol-based polymer, (b) a compound capable of generating a sulfonic acid at a temperature of 100° C. or more, (c) a phenol-based acid crosslinking agent having two or more benzene rings and capable of crosslinking with the polymer under the action of an acid, and (d) a solvent to form a lower (layer) resist layer;
   forming on the lower (layer) resist layer an upper layer resist composition to from an upper (layer) resist layer; and irradiating a high energy ray to form a pattern.

9. The pattern-forming method as claimed in claim 8, wherein the phenol-based polymer is at least one member selected from a novolak resin and a homopolymer or copolymer having a polyvinyl phenol site.

10. The pattern-forming method as claimed in claim 8, wherein the phenol-based polymer is a copolymer having a polyvinyl phenol site and at a side chain at least one group selected from the group consisting of a chain hydrocarbon group, an alicyclic hydrocarbon group and a bridged alicyclic hydrocarbon group.

11. The pattern-forming method as claimed in claim 8, wherein the phenol-based acid crosslinked agent has from 3 to 5 benzene rings.

12. The pattern-forming method as claimed in claim 8, wherein the compound capable of generating a sulfonic acid is at least one member selected from a secondary or tertiary alcohol ester of sulfonic acid and an iodonium salt of sulfonic acid.

13. The pattern-forming method as claimed in claim 8, wherein the lower layer resist composition further contains a nitrogen-containing compound.

14. The pattern-forming method as claimed in claim 8, wherein the lower layer resist composition further contains a surfactant.

* * * * *